(12) United States Patent
Tatsumi

(10) Patent No.: US 6,321,183 B1
(45) Date of Patent: Nov. 20, 2001

(54) SEMICONDUCTOR DEVICE CHARACTERISTIC SIMULATION APPARATUS AND ITS METHOD

(75) Inventor: Takaaki Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/103,709

(22) Filed: Jun. 24, 1998

(30) Foreign Application Priority Data

Jun. 25, 1997 (JP) .................................................. P9-169104

(51) Int. Cl.[7] .................................................. G06F 17/50
(52) U.S. Cl. .................................... 703/14; 703/2; 716/19
(58) Field of Search ........................ 703/2, 13, 5; 716/1, 716/19

(56) References Cited

U.S. PATENT DOCUMENTS

| | | | |
|---|---|---|---|
| 5,105,362 | 4/1992 | Kotani | 700/108 |
| 5,307,296 | * 4/1994 | Uchida et al. | 716/20 |
| 5,761,481 | * 6/1998 | Kadoch et al. | 703/2 |
| 5,859,784 | * 1/1999 | Sawahata | 703/13 |
| 5,886,906 | * 3/1999 | Tatsumi et al. | 703/14 |

FOREIGN PATENT DOCUMENTS

WO 97/21244  6/1997 (WO).

OTHER PUBLICATIONS

Van Godbold et al, "Thermal Analysis of High Power Modules", IEEE 1995 Applied Power Electronics Conference and Exposition, pp. 140–146, Mar. 1995.*

"Wafer Map Distribution of Statistically Correlated Parameters", Simulation Standard, For Circuit Simulation and Spice Modeling Engineers, Silvaco International, vol. 7, No. 9, Sep. 1996, pp. 1–3.

"Diagnose Process Variations By Using PSC Charts and a Wafer Map", Simulation Standard, For Circuit Simulation and Spice Modeling Engineers, Silvaco International, vol. 8, No. 3, Mar. 1997, pp. 1–2.

* cited by examiner

Primary Examiner—Kevin J. Teska
Assistant Examiner—Samuel Broda
(74) Attorney, Agent, or Firm—Sonnenschein, Nath & Rosenthal

(57) ABSTRACT

In a semiconductor device characteristic simulation apparatus and its method, performance characteristics of a semiconductor integrated circuit are image-displayed as a distribution on a semiconductor substrate without actually fabricating the semiconductor integrated circuit. To simulate the fluctuation in device characteristic values of a plurality of semiconductor integrated circuits formed on a semiconductor substrate by applying various types of processing to the semiconductor substrate, the present invention generates simulation data for executing simulations in accordance with measured data for a plurality of predetermined portions on the semiconductor substrate after processed, calculates device characteristic values of the semiconductor integrated circuits in accordance with the simulation data, and displays the fluctuation of device characteristic values as a distribution on the semiconductor substrate.

6 Claims, 4 Drawing Sheets

```
IMPL   DOPANT=B   ENERGY=20   DEVI=DOSE   FILE=WafData.imp
```

FIG. 5 A

```
MASK   1.0  2.5  PROP=GATE   DEVI=LENGTH   FILE=WafData.gate
```

FIG. 5 B

| | |
|---|---|
| 1  1.203e13 | 1  1.5535 |
| 2  1.253e13 | 2  1.5586 |
| 3  1.202e13 | 3  1.5574 |
| 4  1.065e13 | 4  1.5530 |
| 5  1.200e13 | 5  1.5472 |
| ...... | ...... |
| 48  1.084e13 | 48  1.5837 |
| 49  1.013e13 | 49  1.6078 |
| UNIT:atoms/cm$^2$ | UNIT: $\mu$m |

```
IMPL    DOPANT=B   ENERGY=20   DOSE=1.203e13

MASK    1.0   2.5535
```

FIG. 7

SEMICONDUCTOR DEVICE CHARACTERISTIC SIMULATION APPARATUS AND ITS METHOD

BACKGROUND OF THE INVENTION

1. Field of the Invention

The present invention relates to a semiconductor device characteristic simulation apparatus and its method, and is suitably applied to, for example, a semiconductor device characteristic simulation apparatus and its method for estimating and analyzing performance characteristics of a semiconductor integrated circuit constituted by connecting such circuit devices as a transistor to a semiconductor substrate.

2. Description of the Related Art

A conventional semiconductor integrated circuit represents a semiconductor device in which electronic circuits are constituted like a matrix by setting necessary components such as a transistor, a diode, a resistor, and a capacitor on a silicon substrate (a wafer) and interconnecting the components. For example, in a fabrication process of a semiconductor integrated circuit by forming metal oxide semiconductor (MOS) transistors on the entire surface of a wafer like a matrix, a fluctuation exists in each data of dimensions including a gate length, oxide film thickness, and implanted number of ions (hereinafter, these processing factors under fabrication are referred to as process parameters) of a MOS transistor formed by applying predetermined types of processing to the surface of the wafer.

A simulation apparatus and simulation software are developed for estimating and analyzing the fluctuation in device characteristic values of a MOS transistor formed on the surface of a wafer (what the device characteristic value denotes in this case is a voltage applied to the gate portion of the transistor so that a drain current with a certain value starts to flow. Such voltage is hereinafter referred to as threshold voltage Vth), and, moreover, checking the electric current distribution.

Therefore, this type of simulation apparatus calculates (simulates) a fluctuation in device characteristic values (the fluctuation in threshold voltages Vth) of MOS transistors which are fabricated with varying measurement data on each process parameter such as a gate length, oxide film thickness and implanted number of ions, and graphs out the calculation in normal distribution curves. Thereby, when a MOS transistor is formed on the surface of a wafer with a fluctuation in measurement data of process parameters, a user reads the device characteristic values of the transistor from the graph obtained thus.

The aforesaid simulation apparatus can display the fluctuation in device characteristic values in the form of a table or a graph when a MOS transistor is formed on the surface of a wafer and each process parameter fluctuates in accordance with a normal distribution. However, the said apparatus have neither a function for displaying the distribution of the fluctuation in each process parameter in accordance with fluctuating measurement data of process parameters under a fabrication process, nor a function for image-displaying the distribution of the fluctuation in device characteristic values on the surface of the actual wafer.

SUMMARY OF THE INVENTION

In view of foregoing, an object of the present invention is to provide a semiconductor device characteristic simulation apparatus and its method in which performance characteristics of a semiconductor integrated circuit are image-displayed as a distribution on a semiconductor substrate for accurate estimation and analysis without actually fabricating the semiconductor integrated circuit.

The foregoing object and other objects of the invention have been achieved by the provision of a semiconductor device characteristic simulation apparatus and its method in which: for simulating the fluctuation in device characteristic values of a plurality of semiconductor integrated circuits formed on a semiconductor substrate by applying a plurality of processing to the semiconductor substrate, simulation data for executing the simulation in accordance with measurement data on a plurality of predetermined portions on the semiconductor substrate after the processing are generated; device characteristic values of the semiconductor integrated circuit are calculated based on the simulation data; and the distribution of the fluctuation in the device characteristic values on the semiconductor substrate are image-displayed.

By displaying the fluctuation in device characteristic values generated when forming a semiconductor integrated circuit on a semiconductor substrate in accordance with the simulation data generated in accordance with the measurement data for predetermined portions after applying various types of processing to the substrate as a distribution on the semiconductor substrate, it is possible to display the distribution of the fluctuation in device characteristic values of the semiconductor integrated circuit on the semiconductor substrate so as to be easily visually recognized.

As described above, according to the present invention, it is possible to realize a semiconductor device characteristic simulation apparatus for accurate estimation and analysis of performance characteristics of a semiconductor integrated circuit by image-displaying the distribution of the performance characteristics on a semiconductor substrate without actually fabricating the semiconductor integrated circuit.

The nature, principle and utility of the invention will become more apparent from the following detailed description when read in conjunction with the accompanying drawings in which like parts are designated by like reference numerals or characters.

BRIEF DESCRIPTION ON THE DRAWINGS

In the accompanying drawings:

FIGS. 5A and 5B are schematic diagrams showing screen contents of initialization data D1;

FIGS. 6A and 6B are schematic diagrams showing screen contents of measurement data D3; and FIG. 7 is a schematic diagram showing screen contents of simulation data D4.

DETAILED DESCRIPTION OF THE EMBODIMENT

Figure 1:
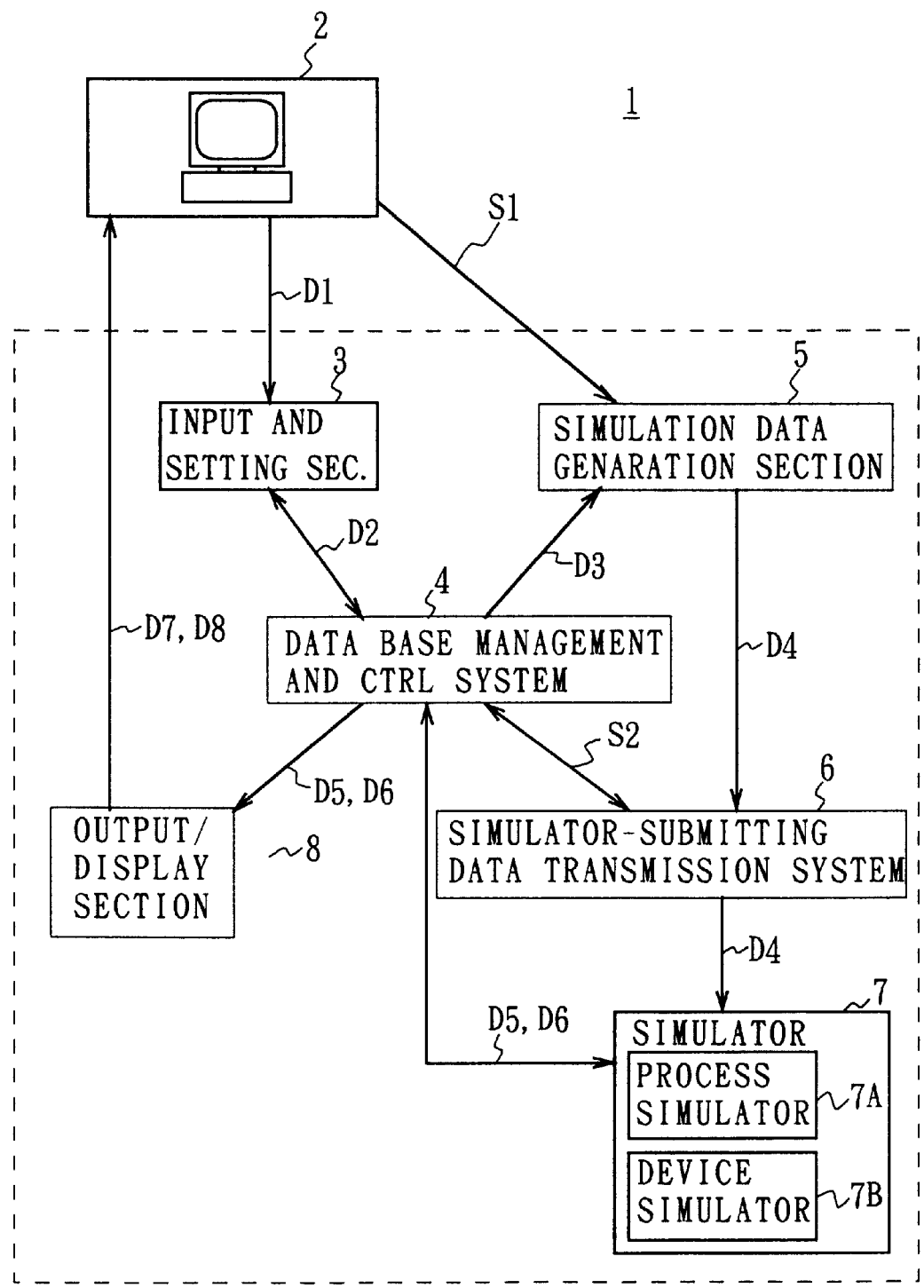
FIG. 1 is a block diagram showing the structure of the simulation apparatus of an embodiment of the present invention.

Preferred embodiments of the present invention will be described with reference to the accompanying drawings:

In FIG. 1, symbol 1 denotes a simulation apparatus of the present invention as a whole. For estimating and analyzing the fluctuation in threshold voltages Vth of a plurality of MOS transistors formed like a matrix on the surface of a wafer, the simulation apparatus 1 first sets measurement data (in this case, implanted number of ions and gate length) via a keyboard (not shown) of a personal computer 2 (this setting is hereinafter referred to as initialization), and transmits the initialization data D1 thus set to an input and setting section 3, setting the measurement data on each process parameter to be used.

Figure 2:
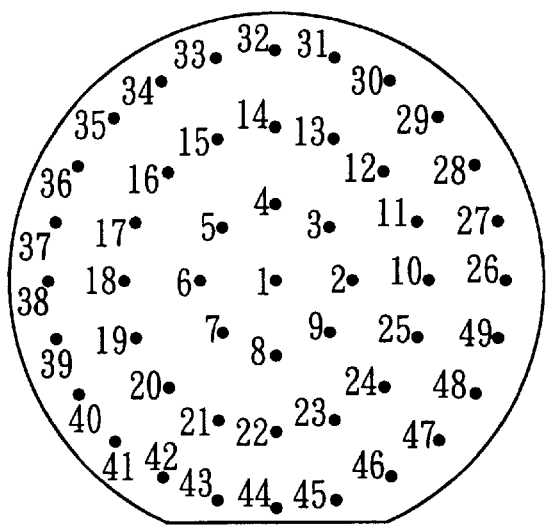
FIG. 2 is a schematic diagram showing measurement points on the surface of a wafer.

The input and setting section 3 converts the initialization data D1 into a predetermined format and transmits the results to a data base management and control system 4 as initialization data D2. The data base management and control system 4 comprises an internal memory and a central processing unit (CPU), which generally controls the whole of the simulation apparatus 1. The system 4 stores measurement data D3 on each process parameter at a plurality of measurement points on the surface of a wafer shown in FIG. 2 (in this case, forty-nine points) in a predetermined storage area of the internal memory as a predetermined file in advance.

The data base management and control system 4 reads the measurement data D3 on predetermined portions measured at forty-nine measurement points on the surface of a wafer for each process parameter from the predetermined file of the internal memory in accordance with the initialization data D2 and transmits the data D3 to a simulation data generation section 5. When the simulation data generation section 5 receives a control signal S1 from the personal computer 2, for example, by user's pressing an execution key, it automatically generates simulation data D4 corresponding to all of forty-nine measurement points in accordance with the set measurement data D3 and transmits the data D4 to a simulator-submitting data transmission section 6.

The simulator-submitting data transmission section 6 transmits the simulation data D4 to a simulator 7 in accordance with a control signal S2 sent from the data base management and control system 4. In this case, the data base management and control system 4 checks the simulation state executed by the simulator 7 and, when the simulator 7 is ready for executing the next simulation, supplies the control signal S2 to the simulator-submitting data transmission section 6.

The simulator 7 is constituted with a process simulator 7A and a device simulator 7B, which calculates the fluctuation in the implanted number of ions (this is referred to as dose) and the fluctuation in gate lengths on the surface of a wafer by using the simulation data D4 generated for each process parameter by the process simulator 7A and thereby, executing simulations and transmits these simulation results to the data base management and control system 4 as simulation result data D5.

Moreover, the simulator 7 executes a simulation by using the simulation data D4 generated for each process parameter by the device simulator 7B and thereby, calculates the fluctuation in device characteristic values of a MOS transistor formed on the surface of a wafer and transmits these simulation results to the data base management and control system 4 as simulation result data D6.

The data base management and control system 4 stores the simulation result data D5 and D6 in a predetermined area of an internal memory (not shown) and transmits the data D5 and D6 to an output/display section 8. The output/display section 8 converts the simulation result data D5 and D6 into the predetermined format for displaying the data D5 and D6 on the display of the personal computer 2 and transmits the formatted data D5 and D6 to the personal computer 2 as display data D7 and D8.

Figure 3:
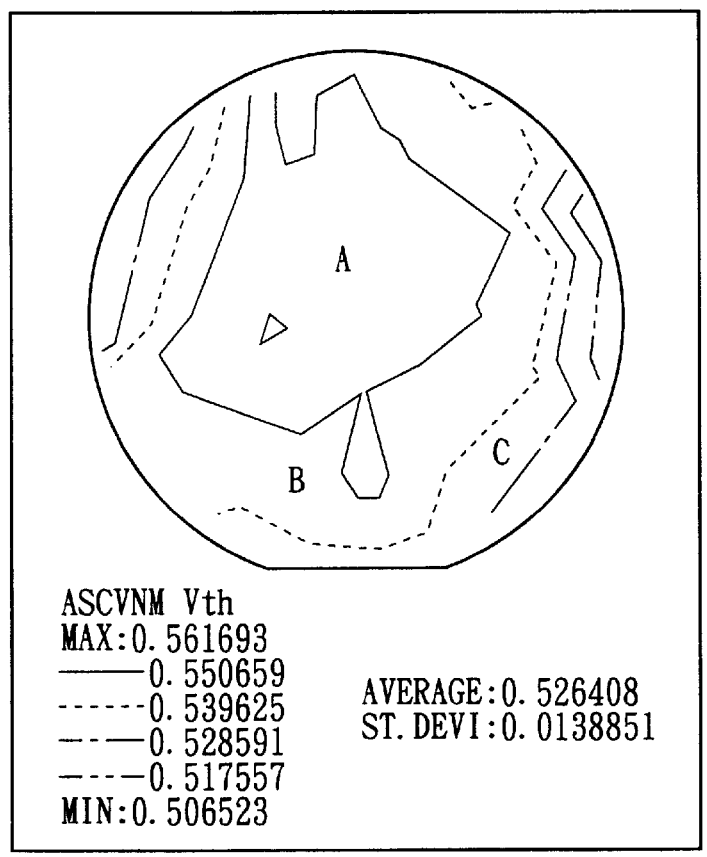
FIG. 3 is a schematic diagram showing a distribution on the surface of a wafer showing simulation results.

The personal computer 2 image-displays the simulation results (in this case, the fluctuation in doses and gate lengths on the surface of a wafer) on the display as a distribution on the surface of a wafer in accordance with display data D7, and image-displays simulation results (in this case, the fluctuation in threshold voltages Vth of a MOS transistor formed on the surface of a wafer) on the display as a distribution on the surface of a wafer in accordance with display data D8. FIG. 3 shows a case of image-displaying the distribution of the fluctuation in threshold voltages Vth on the surface of a wafer.

As shown in FIG. 3, in the case of the simulation results image-displayed on the display of the personal computer 2, the distribution of the fluctuation in threshold voltages Vth applied to the gate portion of a MOS transistor formed on the surface of a wafer are displayed in different colors for each of the areas. For example, the maximum value of the threshold voltages Vth on the surface of a waver is 0.561693 V and the minimum value of them is 0.506523 V.

Moreover, a threshold voltage Vth ranges from 0.561693 V (the maximum value) to 0.550659 V at the inner circumference side of the area A delineated by a continuous line on the surface of a wafer, and a threshold voltage Vth ranges 0.550659 V to 0.539625 V at the inner circumference side of the area B delineated by a broken line. Subsequently similarly, down to the minimum value, the threshold voltages Vth are classified into areas and displayed in different colors. Moreover, "AVERAGE:0.526408" represents the average value of threshold voltages Vth and "ST.DEVI:0.0138851" represents the magnitude of the fluctuation in threshold voltages Vth, so-called standard deviation.

Thereby, by recognizing the areas classified by the color on the surface of a wafer image-displayed on a display, a user can easily recognize the distribution of the fluctuation in threshold voltages Vth of a MOS transistor formed on the surface of a wafer.

Practically, the simulation apparatus 1 performs a simulation for each of combinations of the measurement data D3 in which process parameters (doses and gate lengths) on the surface of a wafer or the surfaces of a plurality of wafers fluctuate in order to reflect the influences of doses and gate lengths on the surface of a wafer correctly on simulation results, so as to be able to estimate the fluctuation in device characteristic values in accordance with each simulation result.

In this case, the distribution of the fluctuation in device characteristic values on the surface of a wafer is caused by the "peculiarity" of each fabrication system for fabricating a semiconductor integrated circuit, and each fabrication system has an intrinsic pattern of peculiarity. The simulation apparatus 1 can calculate and estimate device characteristic values of the semiconductor integrated circuit to be fabricated for each fabrication system by collecting and storing the measurement data D3, which may vary from a manufacturing apparatus to another, in the internal memory.

Figure 4:
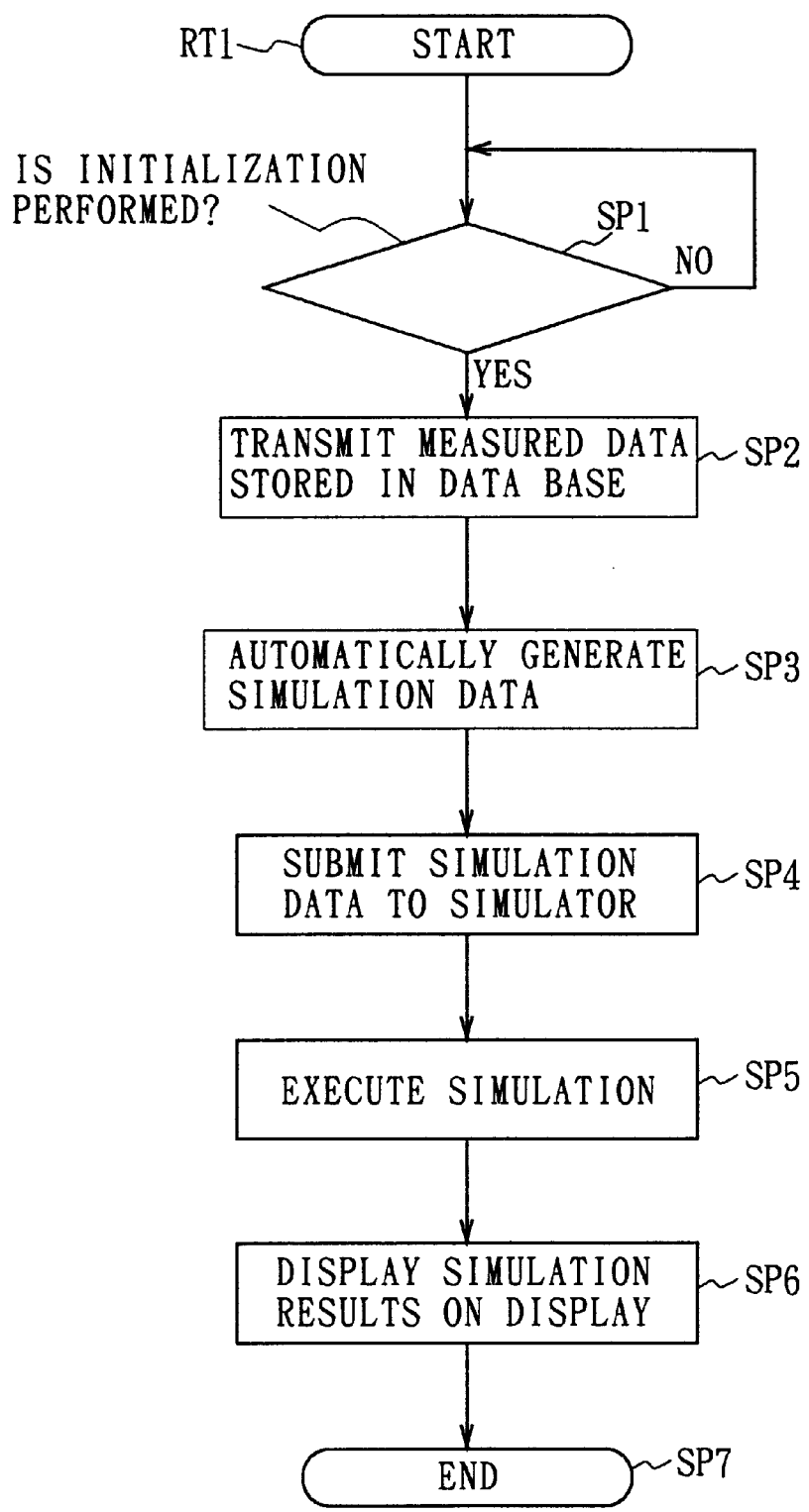
FIG. 4 is a flow chart showing the processing procedure of a simulation apparatus.

Then, the procedure for displaying a simulation result by the simulation apparatus 1 is described below by referring to the flow chart in FIG. 4. That is, the simulation apparatus 1 starts the start step in RT1 and then starts step SP1. In step SP1, the simulation apparatus 1 decides by the data base management and control system 4 whether the initialization data D1 for setting which type of the measurement data D3 is used to execute a simulation is inputted by a user through the keyboard of the personal computer 2.

The negative result, in this case, shows that the initialization data D1 is not inputted by a user and therefore, the data base management and control system 4 restarts step SP1 to repeat the above processing until the initialization data D1 is inputted. The affirmative result in step SP1, on the other hand, shows that the initialization data D1 is inputted by a user. Then, the data base management and control system 4 starts step SP2.

Contents of the initialization data D1 are described below by using FIGS. 5A and 5B. As shown in FIG. 5A, the initialization data D1 shows a fabrication process for ion implantation by "IMPL(Implant)," shows applying of the processing for implanting boron onto a wafer at "20 Kev" by "DOPANT=B" and "ENERGY=20," shows the data in which doses (implanted number of ions) fluctuate by "DEVI=DOSE" ("DEVI" stands for deviation), and finally shows by "FILE=WafData.imp" that the measurement data D3 including dose fluctuation for forty-nine measurement points is stored in a file named "WafData.imp."

Moreover, as shown in FIG. 5B, the initialization data D1 shows by "MASK 1.0 2.5" that the gate of a MOS transistor is present in a range of two-dimensional positions of 1.0 to 2.5 (that is, the gate length comes to 2.5−1.0=1.5), shows by "PROP=GATE" ("PROP" stands for property) that an object to be measured is a gate formed by using a gate mask, shows data in which gate lengths fluctuate by "DEVI=LENGHTH," and finally shows by "FILE=WafData.gate" that the measurement data D3 including gate-length fluctuation for forty-nine measurement points are stored in a file named "WafData.gate."

Then, in step SP2, the data base management and control system 4 reads the measurement data D3 for doses and gate lengths at forty-nine points previously stored in the internal memory by the CPU in accordance with the initialization data D1. Then, the system 4 transmits data 1 to the simulation data generation section 5 and starts step SP3. Then, the contents of the measurement data D3, that is, the data stored in the "WafData.imp" file and "WafData.gate" file are described below, referring to FIGS. 6A and 6B.

As shown in FIG. 6A, the data stored in the "WafData.imp" file shows the measurement results of doses at forty-nine measurement points on the surface of a wafer. For example, the dose measured value at the measurement point 1 shows 1.203e13 atoms/cm$^2$ and the dose measured value at the measurement point 49 shows 1.013e13 atoms/cm$^2$. Moreover, as shown in FIG. 6B, the data stored in the "WafData.gate" file shows measured results of gate lengths at forty-nine measurement points on the surface of a wafer. For example, the gate-length measured value at the measurement point 1 shows 1.5535 $\mu$m and the gate-length measured value at the measurement point 49 shows 1.6078 $\mu$m.

In step SP3, the data base management and control system 4 automatically generates the simulation data D4 for executing a simulation in accordance with the measurement data D3 by the simulation data generation section 5 and then starts step SP4. Then, contents of the simulation data D4 are described below by referring to FIG. 7.

For example, the displays "IMPL," "DOPANT=B," "ENERGY=20," and "DOSE=1.203e13" in FIG. 7 show that the dose (implanted number of ions) when implanting boron at "20 Kev" is 1.203e13 atoms/cm$^2$, and "MASK 1.0 2.5535" shows that the gate length is (2.5535−1.0=) 1.5535 $\mu$m. This data is measured at the measurement point 1. Thus, the simulation data D4 includes all data which are automatically generated for each of the measurement points 1 to 49.

In step SP4, the data base management and control system 4 submits the simulation data D4 to the simulator 7 via the simulator-submitting data transmission section 6 and then starts step SP5. In step SP5, the data base management and control system 4 makes the simulator 7 execute a process simulation and a device simulation in accordance with the simulation data D4, and then starts step SP6.

In step SP6, the data base management and control system 4 stores the simulation result data D5 and D6 showing results of executing simulations by the process simulator 7A and device simulator 7B of the simulator 7 in the internal memory, converts the simulation result data D5 and D6 into a predetermined format via the output/display section 8, and transmits the converted data to the personal computer 2 as display data D7 and DB. Thereby, the personal computer 2 image-displays the distribution of the fluctuation in doses on the surface of a wafer, the distribution of the fluctuation in gate lengths, and the distribution of the fluctuation in device characteristic values on the surface of a wafer on the display and then starts step SP7 to complete the processing.

In the above structure, the simulation apparatus 1 reads the measurement data D3 for doses and gate lengths at forty-nine measurement points on the surface of a wafer from the internal memory of the data base management and control system 4 by initialization for setting a type of the measurement data D3 to be employed for a simulation via the input and setting section 3, and generates the simulation data D4 by the simulation data generation section 5.

That is, the simulation apparatus 1 can read the measurement data D3 from the internal memory of the data base management and control system 4 and generate the simulation data D4 by the simulation data generation section 5 by only performing initialization. Thereby, it is possible to omit the labor for a user to input measurement data values D3 one by one, improve the operability, and decrease the processing time.

Then, the simulation apparatus 1 can obtain the simulation result data D5 and D6 by executing simulations by the simulator 7 (the process simulator 7A and the device simulator 7B) in accordance with the simulation data D4 and image-display the fluctuation in device characteristic values due to the fluctuation in doses and that of gate lengths in accordance with the simulation result data D5 and D6 as a distribution on the surface of a wafer.

Thus, the simulation apparatus 1 can very visibly and effectively display the fluctuation in device characteristic values of a semiconductor integrated circuit formed on the surface of a wafer by classifying it by color for each area as a distribution on the surface of a wafer and image-displaying it on a display, differently from a conventional case of displaying a graph in the form of a normal distribution. Thus, a user can instantly recognize the fluctuation in threshold voltages on the surface of a wafer by confirming to the display of the personal computer 2.

According to the above structure, the simulation apparatus 1 can easily simulate the performance-characteristic influence of the fluctuation in the measurement data D3 of each process parameters under the fabrication process on the surface of a wafer on the device characteristic values of a semiconductor integrated circuit and moreover, very visibly display the simulation result as the distribution of fluctuation in device characteristic values of a semiconductor integrated circuit formed on the surface of a wafer.

Thus, a user can confirm the distribution of the fluctuation in device characteristic values on the surface of a wafer and thereby, can design a semiconductor integrated circuit in accordance with the accurate simulation result executed by the simulation apparatus 1. Therefore, it is possible to omit a test process by performing a simulation, decrease in time from design through manufacture, and greatly reduce the cost.

For the above embodiment, a case, in which forty-nine points on predetermined portions after processed are measured, and the obtained measurement data D3 are stored in the internal memory of the data base management and control system 4 as a file, is described. However, the present invention is not restricted to the above case. It is also possible to store the measurement data obtained by measuring eighty-one points on the surface of a wafer every predetermined portion in the internal memory of the data base management and control system 4 as a file. Thus, by increasing the number of measurement points, it is possible to more accurately display the distribution of device characteristic values on the surface of a wafer.

Moreover, for the above embodiment, a case, in which the distribution of fluctuation in threshold voltages Vth on the surface of a wafer is image-displayed on the display of the personal computer 2, is described. However, the present invention is not restricted to the above case. It is also possible to display the data including the fluctuations in doses, gate lengths, and threshold voltages Vth for each measurement point (1-49) as a table formed by digitizing the data so that a user can easily recognize the data.

Furthermore, for the above embodiment, a case, in which a dose and a gate length are used as the measurement data D3 read by being initialized, is described. However, the present invention is not restricted to the above case. It is also possible to use the measurement data D3 for other various process parameters including an oxide film thickness. Thereby, it is possible to display the fluctuation in saturated currents Ids and swing values S in addition to threshold voltages Vth serving as device characteristic values as a distribution on the surface of a wafer.

Furthermore, for the above embodiment, a case, in which the data base management and control system 4 having a CPU and an internal memory is used as data base means, is described. However, the present invention is not restricted to the above case. It is also possible to use data base means using other storage medium such as a hard disk instead of the internal memory.

Furthermore, for the above embodiment, a case, in which input and setting means constituted with the keyboard and the input and setting section 3 of the personal computer 2 is used, is described. However, the present invention is not restricted to the above case. It is also possible to use other various input and setting means of inputting and setting the initialization data D1 by directly touching the display of the personal computer 2 as long as the initialization data D1 can be inputted and set.

Furthermore, for the above embodiment, a case, in which display means constituted with the output/display section 8 and the display of the personal computer 2 is used, is described. However, the present invention is not restricted to the above case. It is also possible to use other various display means as long as the fluctuation in device characteristic values of a semiconductor integrated circuit can be image-displayed as a distribution on the surface of a wafer.

While there has been described in connection with the preferred embodiment of the invention, it will be obvious to those skilled in the art that various changes and modifications may be aimed, therefore, to cover in the appended claims all such changes and modifications as fall within the true spirit and scope of the invention.

What is claimed is:

1. A semiconductor device characteristic simulation apparatus for simulating a fluctuation in device characteristic values of a plurality of semiconductor integrated circuits formed on a semiconductor substrate by applying a plurality of processing to said semiconductor substrate, said semiconductor device characteristic simulation apparatus comprising:

simulation data generation means for generating simulation data for executing a simulation in accordance with a plurality of measurement data of a plurality of predetermined portions on a surface of said semiconductor substrate after processed;

simulation means for calculating the device characteristic values of said semiconductor integrated circuits in accordance with said simulation data; and display means for displaying the fluctuation in said device characteristic values as a distribution over the surface of said semiconductor substrate.

2. The semiconductor device characteristic simulation apparatus according to claim 1, wherein said simulation data generation means generates simulation data in accordance with the measurement data read from data base means storing the measurement data on said predetermined portions by setting said predetermined portions by input and setting means.

3. The semiconductor device characteristic simulation apparatus according to claim 1, wherein:

said simulation means calculates the fluctuation in said measurement data in accordance with said simulation data; and said display means displays the fluctuation in said measurement data as a distribution on said semiconductor substrate.

4. A semiconductor device characteristic simulation method for simulating a fluctuation in device characteristic values of a plurality of semiconductor integrated circuits formed on a semiconductor substrate by applying a plurality of processing to said semiconductor substrate, said semiconductor device characteristic simulation method comprising:

the first step of generating simulation data for executing a simulation in accordance with a plurality of measurement data on a plurality of predetermined portions on a surface of said semiconductor substrate after processed;

the second step of calculating the device characteristic values of said semiconductor integrated circuits in accordance with said simulation data; and the third step of displaying the fluctuation in said device characteristic values as a distribution over the surface of said semiconductor substrate.

5. The semiconductor device characteristic simulation method according to claim 4, wherein said first step generates simulation data in accordance with the measurement data read from data base means storing the measurement data on said predetermined portions by setting said predetermined portions via input and setting means.

6. The semiconductor device characteristic simulation method according to claim 4, wherein:

said second step calculates the fluctuation in said measurement data in accordance with said simulation data; and said third step displays the fluctuation in said measurement data as a distribution on said semiconductor substrate.

* * * * *